United States Patent
Liu et al.

(10) Patent No.: US 10,833,017 B2
(45) Date of Patent: Nov. 10, 2020

(54) CONTACT FOR SEMICONDUCTOR DEVICE

(71) Applicant: QUALCOMM Incorporated, San Diego, CA (US)

(72) Inventors: Yanxiang Liu, San Diego, CA (US); Haining Yang, San Diego, CA (US); Youseok Suh, San Diego, CA (US); Jihong Choi, San Diego, CA (US); Junjing Bao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 706 days.

(21) Appl. No.: 15/352,342

(22) Filed: Nov. 15, 2016

(65) Prior Publication Data

US 2018/0076139 A1     Mar. 15, 2018

Related U.S. Application Data

(60) Provisional application No. 62/394,128, filed on Sep. 13, 2016.

(51) Int. Cl.
| | |
|---|---|
| *H01L 23/535* | (2006.01) |
| *H01L 21/768* | (2006.01) |
| *H01L 23/485* | (2006.01) |
| *H01L 23/532* | (2006.01) |

(52) U.S. Cl.
CPC ...... *H01L 23/535* (2013.01); *H01L 21/76831* (2013.01); *H01L 21/76843* (2013.01); *H01L 21/76895* (2013.01); *H01L 21/76897* (2013.01); *H01L 23/485* (2013.01); *H01L 23/53209* (2013.01); *H01L 23/53223* (2013.01); *H01L 23/53238* (2013.01); *H01L 23/53266* (2013.01); *H01L 21/76805* (2013.01)

(58) Field of Classification Search
None
See application file for complete search history.

(56) References Cited

U.S. PATENT DOCUMENTS

| | | | | |
|---|---|---|---|---|
| 7,592,650 | B2 | 9/2009 | Hshieh | |
| 7,851,350 | B2* | 12/2010 | Cho | H01L 21/76831 257/E21.577 |
| 8,518,819 | B2* | 8/2013 | Chang | H01L 23/485 257/309 |
| 8,536,050 | B2* | 9/2013 | Frohberg | H01L 21/76816 257/E21.011 |

(Continued)

OTHER PUBLICATIONS

International Search Report and Written Opinion—PCT/US2017/045567—ISA/EPO—dated Nov. 2, 2017.

*Primary Examiner* — Telly D Green
(74) *Attorney, Agent, or Firm* — Holland & Hart LLP

(57) ABSTRACT

A semiconductor device may include a source/drain contact trench adjacent to a gate. The source/drain contact trench may include a first portion and a second portion on the first portion. The semiconductor device also may include an insulating contact spacer liner within the source/drain contact trench. The insulating contact spacer liner contacts the first portion but not the second portion of the source/drain contact trench. The semiconductor device may further include a conductive material within the insulating contact spacer liner and the second portion of the source/drain contact trench. The conductive material may land in a source/drain region of the semiconductor device.

12 Claims, 12 Drawing Sheets

(56) References Cited

U.S. PATENT DOCUMENTS

| | | |
|---|---|---|
| 8,981,478 B2 | 3/2015 | Chang et al. |
| 2006/0284229 A1 | 12/2006 | Park |
| 2008/0272492 A1 | 11/2008 | Tsang |
| 2009/0098732 A1* | 4/2009 | Cho .................. H01L 21/76804 |
| | | 438/675 |
| 2010/0193963 A1 | 8/2010 | Richter et al. |
| 2011/0281426 A1* | 11/2011 | Kim .................. H01L 21/76804 |
| | | 438/586 |
| 2011/0291292 A1 | 12/2011 | Frohberg et al. |
| 2012/0235299 A1 | 9/2012 | Chang et al. |
| 2015/0200269 A1 | 7/2015 | Yin et al. |
| 2016/0013313 A1 | 1/2016 | Cheng et al. |
| 2016/0148999 A1 | 5/2016 | Ok et al. |

* cited by examiner

CONTACT FOR SEMICONDUCTOR DEVICE

CROSS-REFERENCE TO RELATED APPLICATION

The present application claims the benefit of U.S. Provisional Patent Application No. 62/394,128, filed on Sep. 13, 2016, and titled "CONTACT FOR SEMICONDUCTOR DEVICE," the disclosure of which is expressly incorporated by reference herein in its entirety.

BACKGROUND

Field

Aspects of the present disclosure relate to semiconductor devices, and more particularly to a contact that reduces spreading resistance and prevents contact to gate shorting.

Background

Interconnect layers connect different components of an integrated circuit. As device geometries become smaller, the separation between interconnect components (such as contacts) and/or transistors becomes smaller.

Some implementations for small geometry circuitry are designed such that a distance between two components (e.g., contact and gate, gate and gate, or between multiple gates) is below or near the limit of design geometry constraints. A distance between a gate contact and an active contact (e.g., contact associated with a source or drain of a transistor), however may be insufficient to prevent shorting. When the spacing between gates becomes small, there is an increased risk that a gate contact will electrically connect to the source/drain contact. As a result, performance of the semiconductor device is degraded.

It would be desirable to have a structure that improves performance of the semiconductor device.

SUMMARY

A semiconductor device may include a source/drain contact trench adjacent to a gate. In one example, the term "source/drain" refers to a source or a drain. The source/drain contact trench may include a first portion and a second portion on the first portion. The semiconductor device may also include an insulating contact spacer liner within the source/drain contact trench. The insulating contact spacer liner contacts the first portion but not the second portion of the source/drain contact trench. The semiconductor device may further include a conductive material within the insulating contact spacer liner and the second portion of the source/drain contact trench, and landing in a source/drain region of the semiconductor device. For example, the conductive material lands in the source/drain region such the conductive material contacts the source/drain region.

In another aspect of the disclosure, a method of making a semiconductor device may include etching a dielectric layer proximate a gate of the semiconductor device without reaching a source/drain region of the semiconductor device to open a first portion of a source/drain contact trench. The method may also include depositing an insulating contact spacer liner within the first portion of the source/drain contact trench. The method may further include etching through the insulating contact spacer liner at a base of the first portion of the source/drain contact trench to open a second portion of the source/drain contact trench to expose a source/drain region of the semiconductor device. Furthermore the method may include depositing a conductive material on an exposed portion of the source/drain region of the semiconductor device.

In yet another aspect of the disclosure, a semiconductor device may include a source/drain contact trench adjacent to a gate. The source/drain contact trench may include a first portion and a second portion on the first portion. For example, the first portion may touch or physically contact the second portion. The semiconductor device may further include means for electrically isolating the source/drain contact trench. The isolating means lines the first portion but not the second portion of the source/drain contact trench. Furthermore, the semiconductor device may include a conductive material within the isolating means and the second portion of the source/drain contact trench, and landing in a source/drain region of the semiconductor device.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
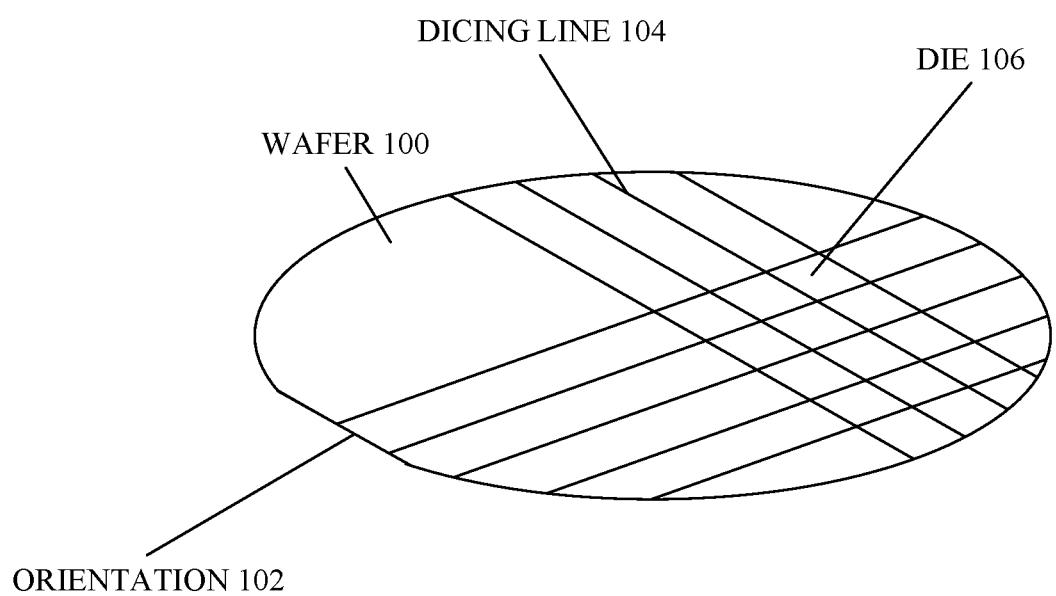
FIG. 1 illustrates a perspective view of a semiconductor wafer in an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR". The term "exemplary" used herein is a non-limiting example.

Semiconductor fabrication processes are often divided into three parts: a front-end-of-line (FEOL), a middle-of-line (MOL) and a back-end-of-line (BEOL). Front-end-of-line processes include wafer preparation, isolation, well formation, gate patterning, spacers, and dopant implantation. A middle-of-line process may include gate and terminal contact formation. The gate and terminal contact formation of the middle-of-line process, however, is an increasingly challenging part of the fabrication flow, particularly for lithography patterning. Back-end-of-line processes include forming interconnects and dielectric layers for coupling to the FEOL devices. These interconnects may be fabricated with a dual damascene process using plasma-enhanced chemical vapor deposition (PECVD) deposited interlayer dielectric (ILD) materials.

Recently, the number of interconnect levels for circuitry has substantially increased due to the large number of transistors that are now interconnected in a modern microprocessor. The increased number of interconnect levels for supporting the increased number of transistors involves more intricate middle-of-line processes to perform the gate and terminal contact formation. Thus, the separation between contacts and/or transistors is very small so that the components (e.g., transistor including gates, contacts, etc.) of current semiconductor devices have to be provided in accordance with a smaller geometry relative to their predecessors.

Some implementations for small geometry circuitry are designed such that a distance between two components (e.g., contact and gate, gate and gate, or between multiple gates) is below or near the limit of design geometry constraints. A distance between a gate contact and an active contact (e.g., contact associated with a source or drain of a transistor), however, may be insufficient to prevent shorting. For example, when the spacing between gates becomes small, there is an increased risk that the gate contact will electrically connect to the source/drain contact. As a result, performance of the semiconductor device is degraded.

In a conductive gate (e.g., metal gate) process (e.g., planar or fin-based (three-dimensional) structure), a smaller geometry increases the likelihood of a short between the gate and a conductive contact to the diffusion region of the semiconductor device. In general, the short may occur in a region that is not within the substrate. For example, the short may occur at a region of the source/drain contact and the gate that is away from (e.g., above) the substrate.

The reduced geometry may lead to opening of a source/drain contact trench for a conductive contact having a tapered shape. The tapered shape of the source/drain contact trench may cause unintended contact between a sidewall of the conductive contact and the gate as the conductive contact tapers toward the gate as the contact extends away from the substrate. The tapered shape of the conductive contact increases the possibility of a short between the conductive contact and the gate. In some aspects, the gate height may be thirty nanometers from a surface of the substrate to a distal portion of the gate.

Mitigating degradation of semiconductor device performance involves isolating one semiconductor device and/or component from one another. In a planar or fin-based (three-dimensional) structure, adjacent devices, such as transistors, may be isolated either physically or electrically. In one example, the term "adjacent" may refer to a neighboring relationship. In another example, the term "adjacent" may refer to a distance relationship understood by persons of ordinary skill in the art or defined by a design rule. In some implementations, to prevent a short between the devices and/or components, spacers may be adopted to separate the devices or components. For example, to prevent a conductive contact to gate short, contact inner spacers are adopted to separate the conductive material of an active contact from the gate. The inner spacer may be deposited inside a contact trench to separate the conductive material of the contact from the gate. In some examples, the term "deposit" may refer to providing by a means that is not limited to deposition.

The inner spacer may be lined on one or more walls (sidewalls) of the contact trench and ultimately also on walls of the contact material when the trench is filled with the contact material. The inner spacer may be provided when the contact hole (or trench) is etched by depositing the inner spacer (e.g., dielectric material) on the sidewalls of the contact trench before the contact material fills the contact trench. The dielectric may be an insulator material such as silicon nitride ($Si_3N_4$) or silicon oxynitride (SiON). The inner contact may prevent a short between the gate and the contact when the contact trench is filled with the conductive material.

When a conductive contact is etched into a substrate (e.g., silicon substrate), however, the inner spacer on the sidewalls of the conductive contact introduces large spreading resistance. For example, current (e.g., charge carriers forming a conductive path) is forced around the inner spacer to reach the channel in the substrate. That is, the flow of charge carriers from the source/drain associated with the conductive contact to a drain/source is impeded by spreading resistance associated with the contact inner spacer when the conductive contact is etched deeper into the substrate. The spreading resistance may substantially degrade the semiconductor device performance.

More specifically, when the contact is etched into the substrate (e.g., source or drain region of the substrate) to prevent separation between the contact and the substrate, the inner spacer blocks the flow of current (e.g., charge carriers) from the conductive contact to the channel. For example, the conductive contact may be etched deeper into the substrate to accommodate different devices or components of different shapes and sizes. The depth of the etch guarantees electrical contact between the conductive contact and a diffusion region of the substrate. To bypass the inner spacer, the current has to spread or be carried over a longer distance, which introduces spreading resistance.

Aspects of the present disclosure are directed to reducing spreading resistance while preventing conductive contact to gate shorting. To achieve this, a contact spacer liner (e.g., an insulating contact spacer liner) may be formed on a first portion of a source/drain contact trench above a source/drain region of a semiconductor device. A second portion of the source/drain contact trench may expose and land in the source/drain region of the semiconductor device. The second portion of the source/drain contact trench does not include the contact spacer liner.

According to aspects of the present disclosure, the contact spacer liner is only deposited in the first (e.g., upper) portion of the source/drain contact trench where it is effective for preventing a short between the gate and the conductive contact. In particular, the contact is not deposited in the second portion of the source/drain contract trench, where the presence of an inner spacer may cause spreading resistance. The first portion of the conductive contact may be separated by a predetermined distance (e.g., 2-5 nanometers) from the gate.

The second (e.g., lower) portion of the source/drain contact trench does not include the contact spacer liner to prevent resistance spreading. The second portion of the conductive contact may be partially below the surface of the substrate where the source/drain contact trench is etched. Conductive contact material may be deposited into the trench on an exposed source/drain region of the substrate. The conductive contact does not extend through the substrate. The second portion of the source/drain contact trench may include a barrier layer (e.g., tantalum nitride or titanium nitride) between a conductive material (e.g., tungsten, copper, aluminum, titanium, or cobalt) and a contact layer (e.g., titanium and/or nickel). For example, to form the contact, multiple layers (e.g., two or more layers) may be deposited into the trench. One of the layers (e.g., first layer) may include a contact silicide layer such as titanium or nickel. The contact silicide layer forms a metal silicide silicon or silicon germanium at the source and/or drain region. Another layer (e.g., second layer) may be deposited on the contact silicide layer and may be referred to as the barrier layer (e.g., titanium nitride). The contact (e.g., conductive material such as copper (Cu), tungsten (W), aluminum or other conductive material) may be deposited in the trench after the first and second layer are deposited in the trench. Because the second portion of the conductive contact is free of the contact spacer liner, contact spreading resistance is low.

Some aspects of the present disclosure are directed to a semiconductor device that reduces spreading resistance and prevents contact to gate shorting. In one aspect of the present disclosure, the semiconductor device may include a source/drain contact trench adjacent to a gate. The source/drain contact trench may include a first portion (e.g., the upper portion) and a second portion (e.g., the lower portion) on the first portion. For example, the first portion may touch, continue from, or may physically contact the second portion. Alternatively, the first portion may be separated from the second portion by an intervening portion and therefore may not be physically in contact with the second portion. The semiconductor device may also include a contact spacer liner within the source/drain contact trench. The contact spacer liner may line the first portion but not line the second portion of the source/drain contact trench. A conductive material (e.g., tungsten) may be deposited into the contact trench to form the conductive contact. The conductive material may extend through the contact spacer liner and the second portion of the source/drain contact trench, and land in a source/drain region of the semiconductor device. In other words, the conductive material may be within the contact spacer liner and the second portion of the source/drain contact trench and physically contact the source/drain region.

In one aspect of the disclosure, a gate spacer may be positioned between the gate and the first portion of the conductive contact. The gate spacer may be on a sidewall of the gate, contacting the first portion, but not the second portion of the source/drain contact trench. The conductive material may be separated from the gate spacer by the contact spacer liner. The gate spacer may be silicon nitride. The contact spacer liner may be an insulator material including silicon nitride ($Si_3N_4$) or silicon oxynitride (SiON). Thus, in some aspects, the gate spacer material may be different from the contact spacer liner material.

The conductive contact may be a source/drain contact configured to contact the source/drain region of the semiconductor device. Accordingly, at least some portions of the second lower portion of the contact may be positioned on the source/drain region of the substrate.

Some aspects of the present disclosure are directed to a method of reducing spreading resistance and preventing contact to gate shorting. The method may involve a two-step contact etch to form a contact to a diffusion region of a semiconductor device. In one aspect of the present disclosure, the method of making the semiconductor device may include a first etch process, which may include etching a dielectric layer proximate a gate of the semiconductor device without etching into the substrate of the semiconductor device. The term "proximate" may indicate a minimum design rule spacing. In another example, "proximate" may be a close spacing understood by persons of ordinary skill in the art. The dielectric layer may be etched to create an active contact trench for the conductive contact, while leaving a portion of a dielectric layer between the active contact trench and the substrate (e.g., the source/drain region of the substrate). The dielectric layer of the semiconductor device may be an inter-layer dielectric (ILD).

A timed etch may be performed to stop at a time corresponding to the first portion of the source/drain contact trench, so that a portion of the dielectric layer remains between the source/drain contact trench and the source/drain region of the semiconductor device. The etching may be a reactive ion etching (RIE), for example, carbon tetrafluoride (CF4) or sulfur hexafluoride (SF6). In some aspects, the etch may be in one direction. For example, the etch may be a directional etch.

In another step of the method, the contact spacer (e.g., a contact spacer liner) may be deposited within only the first portion of the source/drain contact trench. The contact spacer liner may be deposited inside the contact trench to separate conductive material of the conductive contact from an adjacent gate. For example, the contact spacer liner may be deposited on one or more walls (e.g., sidewalls and a base portion) of the source/drain contact trench and ultimately also on walls of the conductive contact when the source/drain contact trench is filled with a conductive contact material. The base of the source/drain contact trench may be on a surface of a portion of the dielectric layer that is between the substrate and the source/drain contact trench. The contact spacer liner may be a low K material.

In a later step of the method, a second etch process may include etching through the contact spacer liner at a base of the source/drain contact trench to open a second portion of the source/drain contact trench exposing and landing in the source/drain region of the semiconductor device. For example, the second etch process may include etching through the contact spacer liner, through the remaining dielectric separating the source/drain contact trench and the substrate and into the substrate (e.g., the source/drain region of the substrate) to expose the source/drain region of the substrate without etching entirely through the substrate. No contact spacer liner is introduced to the newly etched region, which forms the second portion (e.g., a lower portion) of the source/drain contact trench. For example, the second portion of the contact trench is not surrounded with the contact spacer liner to prevent resistance spreading. During the second etch process, when the substrate is contacted, the etch process may be slowed, which signals the start of the etch of the substrate. For example, the etch rate may be reduced, indicating exposure of the source/drain region. The second etch process may be an anisotropic etch to break through the contact spacer liner at the base of the first portion of the source/drain contact trench and further into the source/drain region.

In yet another step of the method, a conductive material may be deposited to fill the source/drain contact trench with the conductive material. For example, the conductive material may be deposited in the source/drain contact trench so that the conductive material is on the exposed portion of the source/drain region of the semiconductor device.

FIG. 1 illustrates a perspective view of a semiconductor wafer in an aspect of the present disclosure. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystallizes onto the seed crystal in the orientation of the crystal.

The wafer 100 may be a compound material, such as gallium arsenide (GaAs) or gallium nitride (GaN), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
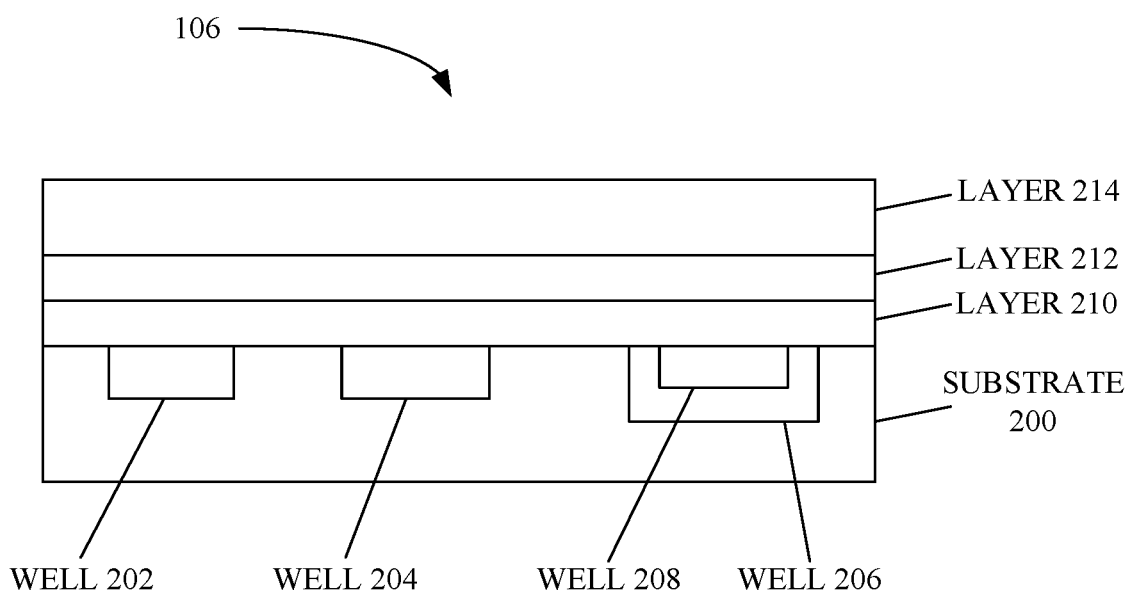
FIG. 2 illustrates a cross-sectional view of a die in accordance with an aspect of the present disclosure.

FIG. 2 illustrates a cross-sectional view of a die 106 in accordance with an aspect of the present disclosure. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

Within a substrate 200 (e.g., a semiconductor substrate), there may be wells 202 and 204, which may be the source and/or drain of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT). The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

Figure 3:
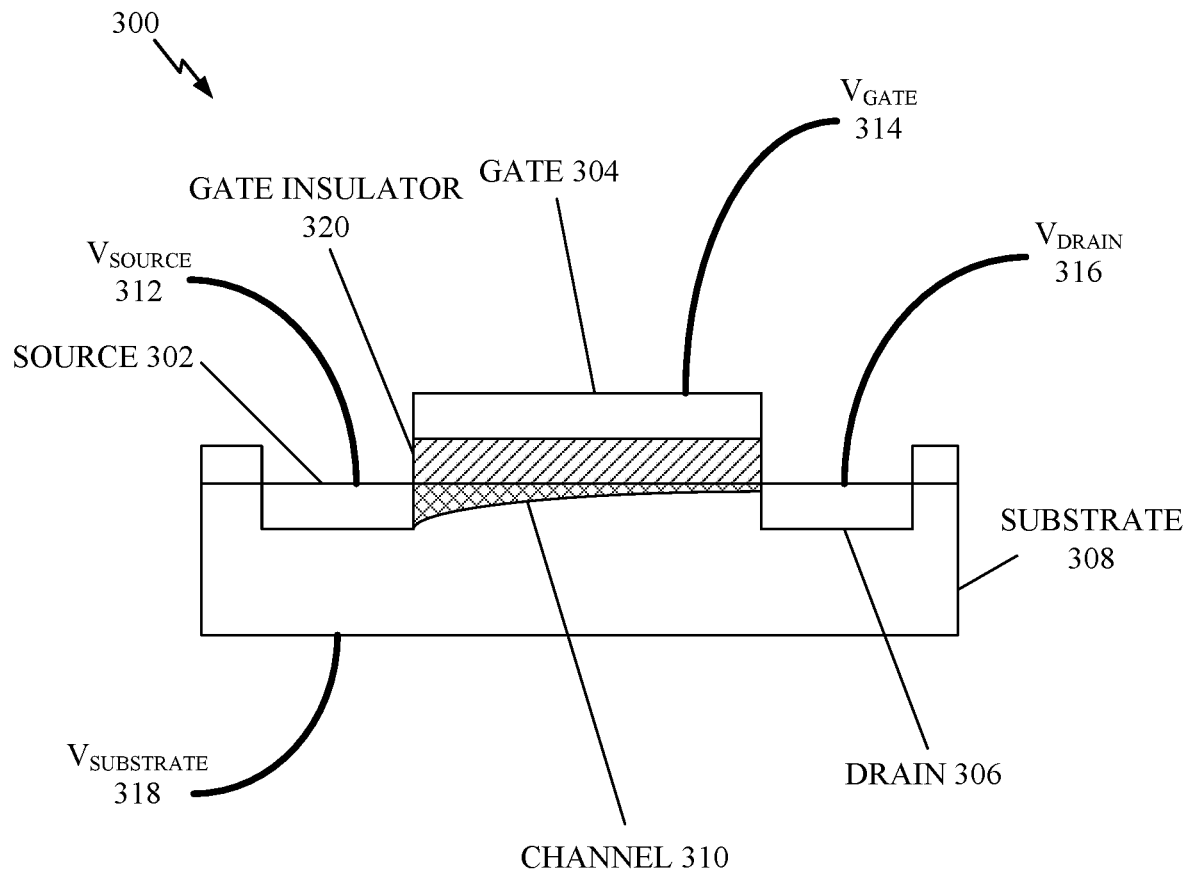
FIG. 3 illustrates a cross-sectional view of a metal-oxide-semiconductor field-effect transistor (MOSFET) device in an aspect of the present disclosure.
Figure 3:
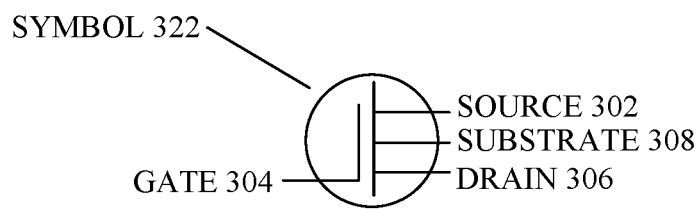

FIG. 3 illustrates a cross-sectional view of a metal-oxide-semiconductor field-effect transistor (MOSFET) device 300 in an aspect of the present disclosure. The MOSFET device 300 may have four input terminals. The four inputs are a source 302, a gate 304, a drain 306, and a substrate 308. The source 302 and the drain 306 may be fabricated as the wells 202 and 204 in the substrate 308, or may be fabricated as areas above the substrate 308, or as part of other layers on the die 106. Such other structures may be a fin or other structure that protrudes from a surface of the substrate 308. Further, the substrate 308 may be the substrate 200 on the die 106, but substrate 308 may also be one or more of the layers (e.g., 210-214) that are coupled to the substrate 200.

The MOSFET device 300 is a unipolar device, as electrical current is produced by only one type of charge carrier (e.g., either electrons or holes) depending on the type of MOSFET. The MOSFET device 300 operates by controlling the amount of charge carriers in the channel 310 between the source 302 and the drain 306. A voltage Vsource 312 is applied to the source 302, a voltage Vgate 314 is applied to the gate 304, and a voltage Vdrain 316 is applied to the drain 306. A separate voltage Vsubstrate 318 may also be applied to the substrate 308, although the voltage Vsubstrate 318 may be coupled to one of the voltage Vsource 312, the voltage Vgate 314 or the voltage Vdrain 316.

To control the charge carriers in the channel 310, the voltage Vgate 314 creates an electric field in the channel 310 when the gate 304 accumulates charges. The opposite charge to that accumulating on the gate 304 begins to accumulate in the channel 310. The gate insulator 320 insulates the charges accumulating on the gate 304 from the source 302, the drain 306, and the channel 310. The gate 304 and the channel 310, with the gate insulator 320 in between, create a capacitor, and as the voltage Vgate 314 increases, the charge carriers on the gate 304, acting as one plate of this capacitor, begin to accumulate. This accumulation of charges on the gate 304 attracts the opposite charge carriers into the channel 310. Eventually, enough charge carriers are accumulated in the channel 310 to provide an electrically conductive path between the source 302 and the drain 306. This condition may be referred to as opening the channel of the FET.

By changing the voltage Vsource 312 and the voltage Vdrain 316, and their relationship to the voltage Vgate 314, the amount of voltage applied to the gate 304 that opens the channel 310 may vary. For example, the voltage Vsource 312 is usually of a higher potential than that of the voltage Vdrain 316. Making the voltage differential between the voltage Vsource 312 and the voltage Vdrain 316 larger will change the amount of the voltage Vgate 314 used to open the channel 310. Further, a larger voltage differential will change the amount of electromotive force moving charge carriers through the channel 310, creating a larger current through the channel 310.

The gate insulator 320 material may be silicon oxide, or may be a dielectric or other material with a different dielectric constant (k) than silicon oxide. Further, the gate insulator 320 may be a combination of materials or different layers of materials. For example, the gate insulator 320 may be Aluminum Oxide, Hafnium Oxide, Hafnium Oxide Nitride, Zirconium Oxide, or laminates and/or alloys of these materials. Other materials for the gate insulator 320 may be used without departing from the scope of the present disclosure.

By changing the material for the gate insulator 320, and the thickness of the gate insulator 320 (e.g., the distance between the gate 304 and the channel 310), the amount of charge on the gate 304 to open the channel 310 may vary. A symbol 322 showing the terminals of the MOSFET device 300 is also illustrated. For N-channel MOSFETs (using electrons as charge carriers in the channel 310), an arrow is applied to the substrate 308 terminal in the symbol 322 pointing away from the gate 304 terminal. For p-type MOSFETs (using holes as charge carriers in the channel 310), an arrow is applied to the substrate 308 terminal in the symbol 322 pointing towards the gate 304 terminal.

The gate 304 may also be made of different materials. In some designs, the gate 304 is made from polycrystalline silicon, also referred to as polysilicon or poly, which is a conductive form of silicon. Although referred to as "poly" or "polysilicon" herein, metals, alloys, or other electrically conductive materials are contemplated as appropriate materials for the gate 304 as described in the present disclosure.

In some MOSFET designs, a high-k value material may be desired in the gate insulator 320, and in such designs, other conductive materials may be employed. For example, and not by way of limitation, a "high-k metal gate" design may employ a metal, such as copper, for the gate 304 terminal. Although referred to as "metal," polycrystalline materials, alloys, or other electrically conductive materials are contemplated as appropriate materials for the gate 304 as described in the present disclosure.

To interconnect to the MOSFET device 300, or to interconnect to other devices in the die 106 (e.g., semiconductor), interconnect traces or layers are used. These interconnect traces may be in one or more of layers (e.g., 210-214), or may be in other layers of the die 106.

Figure 4:
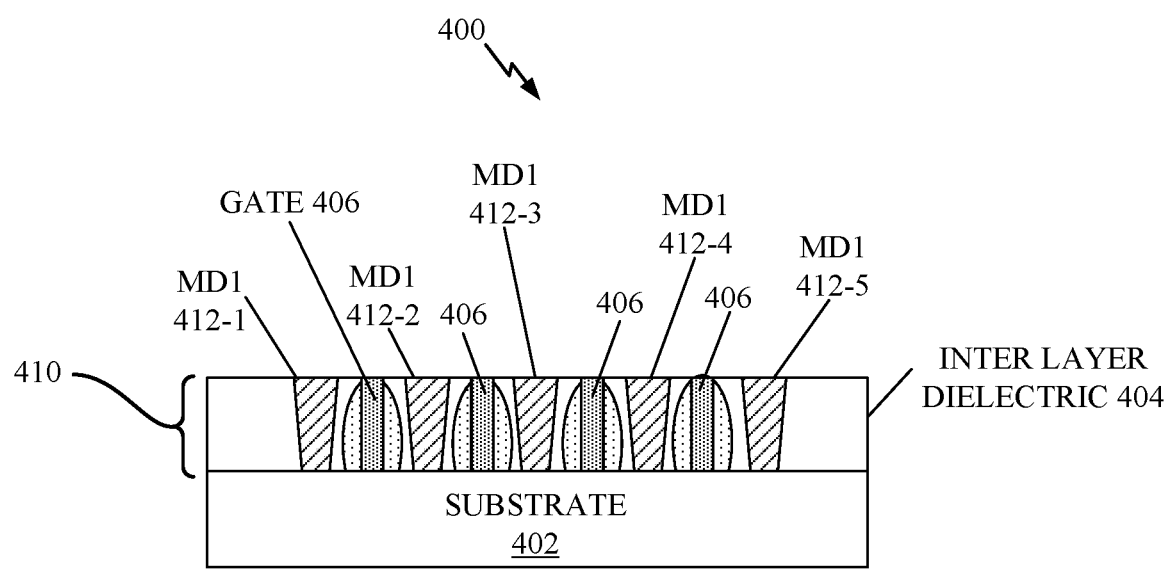
FIG. 4 illustrates a side view of an integrated circuit device including a middle-of-line interconnect layer.

FIG. 4 shows a cross-sectional view illustrating an integrated circuit (IC) device 400 in which routing of conductive layers is performed within a middle-of-line (MOL) interconnect layer 410 according to one aspect of the disclosure. The IC device 400 may include a semiconductor substrate (e.g., a silicon wafer) 402 having inter-layer dielectric 404. Within the inter-layer dielectric 404 and the substrate 402 is an active region in which active devices having a source region, a drain region, and a gate region (e.g., one of the conductive gates 406) are formed.

In FIG. 4, the first MOL interconnect layer 410 may include a set of active (oxide diffusion (OD)) contacts, which are often referred to as metal diffusion (MD1) contacts, shown as MD1 412-1, 412-2, 412,3, 412-4, and 412-5 (collectively or generally referred to as MD1 412). The MD1 active contacts 412 are fabricated on the substrate 402. The active contacts 412 may be coupled to the active devices (e.g., the source and drain regions).

Figure 5:
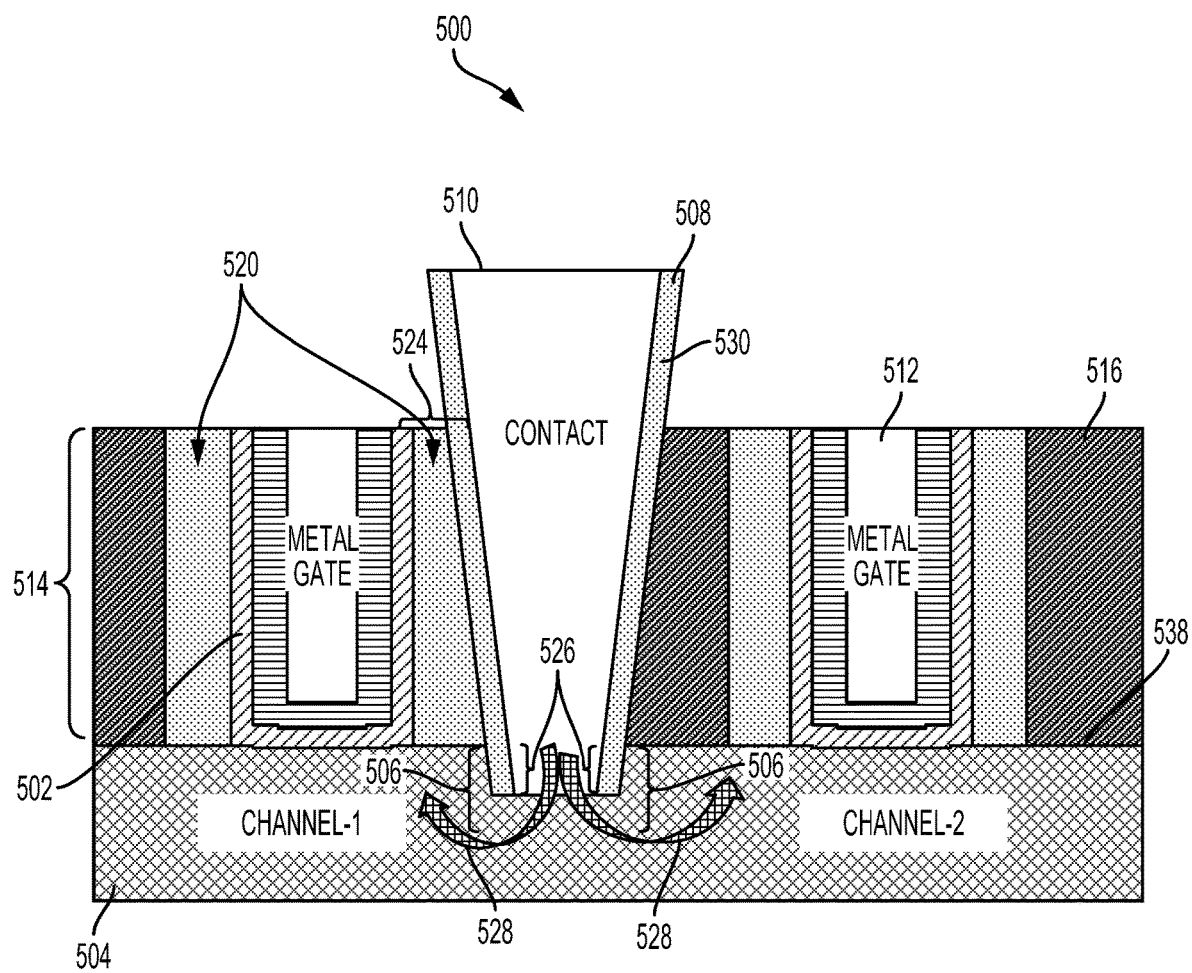
FIG. 5 illustrates a cross-sectional view of a semiconductor device.

FIG. 5 illustrates a cross-sectional view of a semiconductor device 500. The semiconductor device 500 may have several input terminals. The inputs may include a source (not shown) a gate 502 (e.g., similar to the conductive gates 406 or 304), a drain (not shown), and a substrate 504. The source and the drain may be fabricated as wells in the substrate 504, or may be fabricated as areas above the substrate, or as part of other layers on the die 106, if desired. For example, the source/drain may be represented by a source/drain region 506. The source/drain region 506 may be similar to the source 302 or the drain 306 of FIG. 3. Other designs include a fin or other structure that protrudes from a surface of the substrate 504. Although, the substrate 504 may be the substrate 200 on the die 106, the substrate 504 may also be one or more of the layers 210-214 that are coupled to the substrate 200. An adjacent conductive gate 512 is also shown, however, prevention of contact to gate shorting is described below with reference to the gate 502.

The semiconductor device 500 (e.g., an integrated circuit device) may include an interconnect layer 514. In some aspects, the interconnect layer 514 is a middle-of-line (MOL) interconnect layer (e.g., 410 of FIG. 4). The interconnect layer 514 may include an inter-layer dielectric 516, a gate 502, a conductive contact 510, and a gate spacer 520 (e.g., silicon nitride (SiN) spacer). The gate spacer 520 is positioned between the gate 502 and the conductive contact 510. The gate spacer 520 is on a sidewall of the gate 502 and a sidewall of a source/drain contact trench 530.

In some implementations, to prevent a short between the active devices and the conductive contacts, spacers are adopted to electrically isolate the active devices from the conductive contacts. For example, to prevent the conductive contact 510 from shorting the gate 502, a contact spacer liner 508 is deposited to electrically isolate the conductive contact 510 (e.g., tungsten) from the gate 502. The conductive contact 510 may be coupled to the diffusion regions of the active devices (e.g., the source and drain regions) of the substrate. For example, a portion of the conductive contact 510 may touch a source/drain region 506 of the substrate.

The gate spacer 520 and the contact spacer liner 508 prevent the gate 502 from shorting to the conductive contact 510 when a separation 524 between the gate 502 and the conductive contact 510 is very small. In general, the short may occur in a region that is not within the substrate 504. For example, the short may occur at a region of the conductive contact 510 and the gate 502 that is separate from the substrate 504. This follows because the source/drain contact trench 530 and the conductive contact 510 are tapered. For example, the conductive contact 510 tapers toward the gate 502 the further away regions of the conductive contact 510 are from the substrate 504. The increased diameter of the conductive contact 510 toward the gate 502 increases the possibility of a short between the conductive contact 510 and the gate 502, in an area where the conductive contact 510 is closest to the gate 502 (e.g., at separation 524).

When the conductive contact 510 is etched into the substrate 504 (e.g., at or around the contact region 526), the contact spacer liner 508 on the sidewall of the conductive contact 510 proximate the contact region 526 introduces large spreading resistance. For example, current (charge carriers forming a conductive path) has to flow around the contact spacer liner 508 to reach the channel (e.g., Channel-1 and/or Channel-2) in the substrate 504. The spreading resistance may substantially degrade the semiconductor device performance.

For example, when the conductive contact 510 is etched into the substrate 504 to prevent a separation between the conductive contact 510 and the substrate 504, the contact spacer liner 508 blocks the flow of current (e.g., charge carriers) from the conductive contact 510 to the channel. To bypass the contact spacer liner 508, the current is carried over a longer distance (as shown by arrows 528), which introduces spreading resistance.

Aspects of the present disclosure are directed to reducing spreading resistance while preventing contact to gate shorting. To achieve this feature, the inner spacer may be formed only on portions of the contact where the inner spacer is effective to reduce a short between the gate and the contact. The inner space is not formed on other portions where a presence of the inner spacer may cause the spreading resistance.

Figure 6:
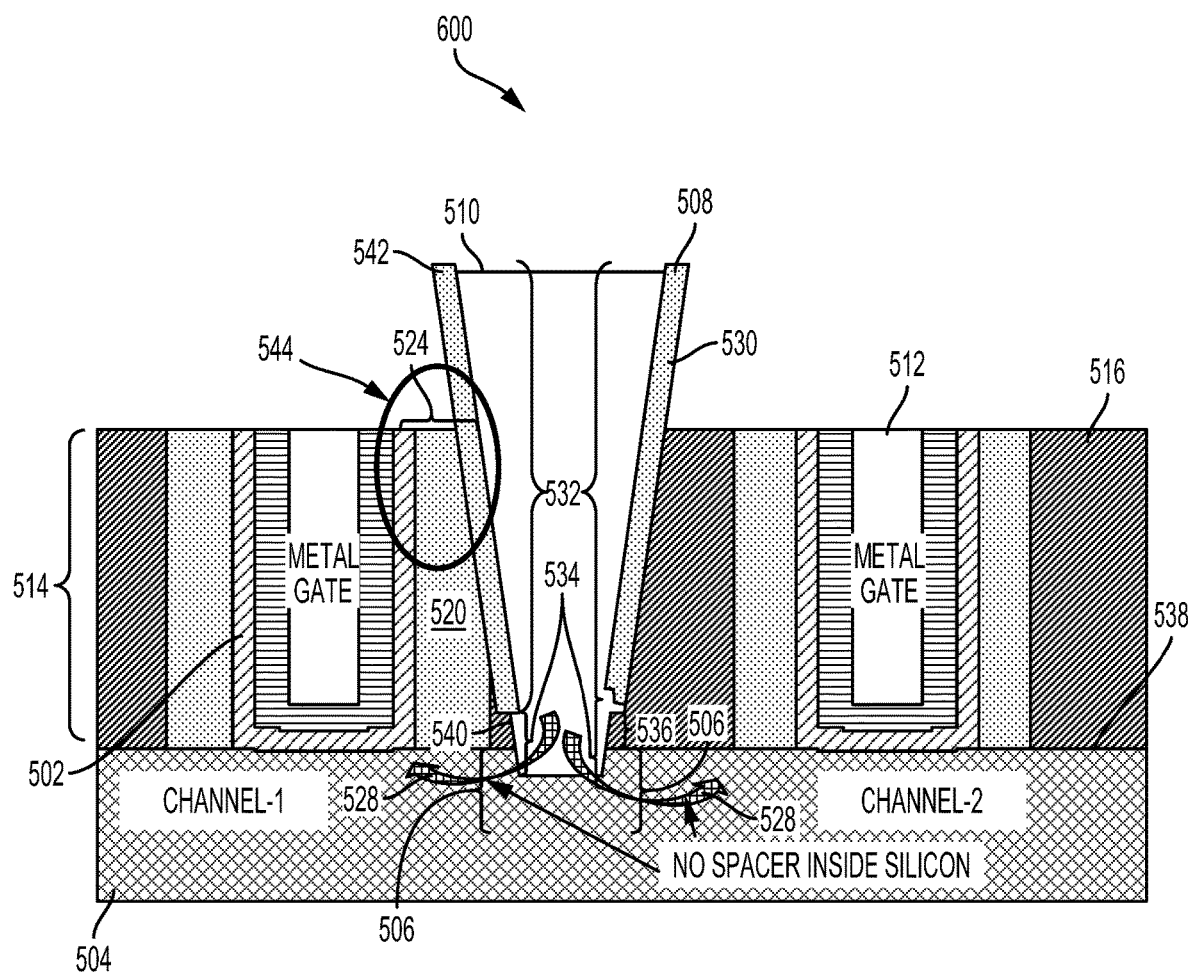
FIG. 6 illustrates a cross-sectional view of a semiconductor device according to an aspect of the present disclosure.

FIG. 6 illustrates a cross-sectional view of a semiconductor device 600 including a contact that reduces spreading resistance and prevents contact to gate shorting according to an aspect of the present disclosure. For illustrative purposes, some of the labelling and numbering of the components and features of FIG. 6 are similar to those of FIG. 5. In one aspect of the present disclosure, the semiconductor device 600 may include the source/drain region 506 adjacent to a gate 502. The gate may include multiple layers of material. For example, the gate 502 may be a replacement metal gate including one or more layers surrounding a conductive material to form a gate electrode.

A source/drain contact trench 530 of the semiconductor device 600 may include a first portion (e.g., the upper portion) 532 and a second portion (e.g., the lower portion) 534 on the first portion 532. The semiconductor device 600 may also include a contact spacer liner (e.g., the inner spacer) 508 within the source/drain contact trench 530. The contact spacer liner 508 contacts the first portion 532 but does not contact the second portion 534 of the source/drain contact trench 530. A conductive material (e.g., tungsten) may be deposited into the source/drain contact trench 530 to form a conductive contact 510. The conductive material may extend through the contact spacer liner 508 and the second portion 534 of the source/drain contact trench 530, and land in a source/drain region 506 of the semiconductor device 600. The second portion may have a height of 205 nm from a surface within the substrate 504 to a section 540, in one exemplary configuration.

In one aspect of the disclosure, a gate spacer 520 may be positioned between the gate 502 and the first portion (or at least some portions of the first portion) 532. The gate spacer 520 may be on a sidewall of the gate 502 and the first portion 532 and not on the second portion 534 of the source/drain contact trench 530. The conductive contact 510 may be separated from the gate spacer 520 by the contact spacer liner 508, an inter-layer dielectric 516 and/or both. The gate spacer 520 and the contact spacer liner 508 prevent the gate 502 from being shorted to the conductive contact 510 when a separation 524 between the gate 502 and the conductive contact 510 is very small. A region 544 at a distal portion of the gate 502 relative to a surface 538 is at risk of a gate to contact short.

The gate spacer 520 may be silicon nitride. The conductive contact 510 may be a source/drain contact configured to provide contact to the source/drain region 506 of the semiconductor device 600. Accordingly, at least some of the second portion 534 of the conductive contact 510 may be positioned on the source/drain region of the substrate 504 or within the source/drain region of the substrate 504.

The contact spacer liner 508 may be formed only on portions (e.g., the first portion 532) of the conductive contact 510 where the contact spacer liner 508 is effective to prevent a short between the gate 502 and the conductive contact 510 and not on other portions (e.g., the second portion 534) where a presence of the contact spacer liner 508 may cause spreading resistance. The first portion 532 of the conductive contact 510 may be separated by a distance 536 from the surface of the substrate 504 where the gate 502 is provided. For example, the first portion 532 of the conductive contact 510 may start from a first upper portion section 540 proximate the substrate 504 and separated from the substrate 504 by the distance 536 to a second upper portion section 542 that is distal from the section 540 of the conductive contact 510 and further away from the surface 538 of the substrate 504.

The second portion 534 of the conductive contact 510 is not surrounded or lined with the contact spacer liner 508 in order to prevent resistance spreading. The second portion 534 may include a non-substrate portion of the spacer that is between the surface of the substrate 504 and the start of the upper portion of the contact (e.g., first upper portion section 540). The second portion 534 of the conductive contact 510 may also include a substrate portion that is below the surface of the substrate 504 when the source/drain contact trench 530 is etched into the substrate 504. The conductive contact 510 may not extend through the substrate 504. Because the second portion 534 of the conductive contact 510 is free of the contact spacer liner 508, contact spreading resistance is low.

FIGS. 7, 8, and 9A-9B illustrate cross-sectional views showing exemplary processing to form a semiconductor device including a contact for reducing spreading resistance and preventing contact to gate shorting, according to aspects of the present disclosure. For illustrative purposes, some or all of the labelling and numbering of the components and features of FIGS. 7, 8, and 9A-9B are similar to those of FIGS. 5 and 6. The method of forming the contact may involve a two-step etch.

Figure 7:
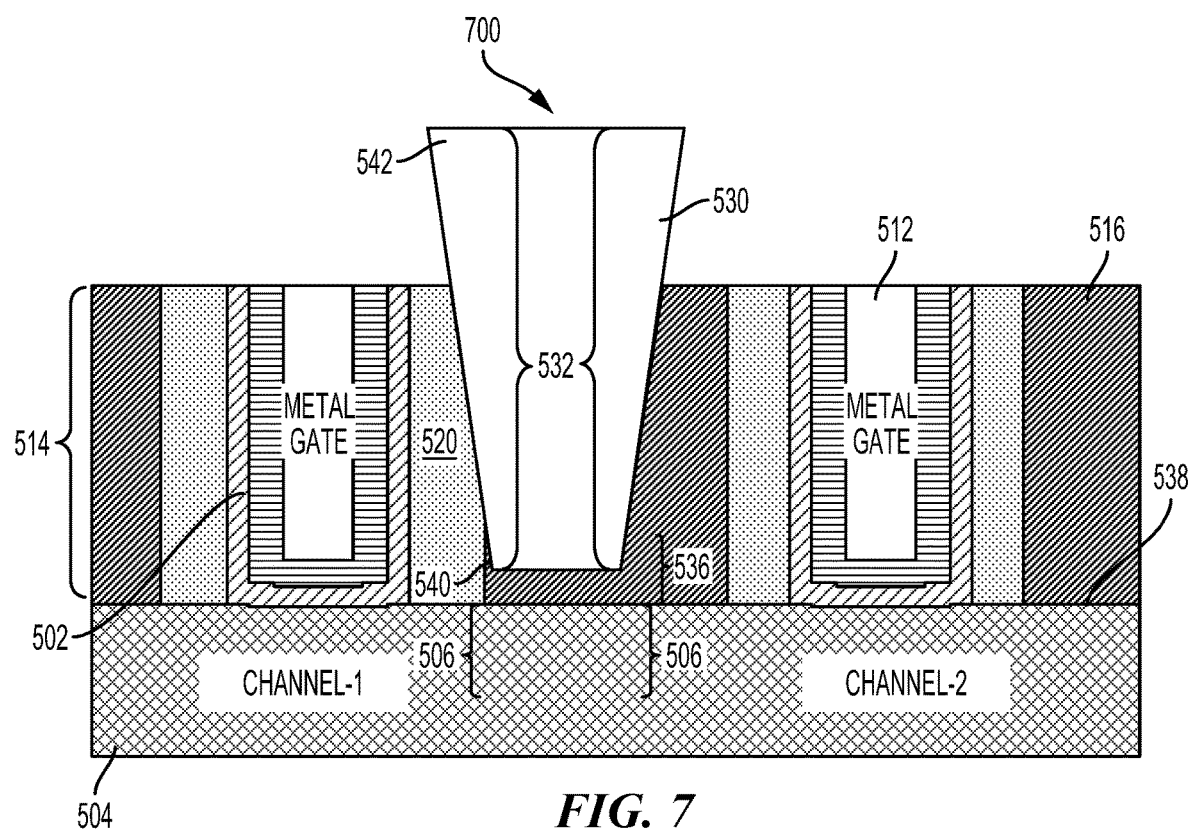
FIGS. 7, 8, and 9A-9B illustrate cross-sectional views of exemplary processing to form a contact according to aspects of the present disclosure. The term "exemplary" refers to a non-limiting example.

FIG. 7 illustrates a first etch of the two-step contact etch according to aspects of the present disclosure. The first etch may include etching the dielectric, insulator, and/or spacer layer proximate a gate 502 of a semiconductor device 700 without etching into a substrate 504 of the semiconductor device 700. The dielectric, insulator, and/or spacer layer may include an inter-layer dielectric 516, a gate spacer 520 or a combination of both. For example, the dielectric, insulator, and/or spacer layer may be etched to open a source/drain contact trench 530 to enable formation of a conductive contact 510, while leaving a layer of the dielectric, insulator, and/or spacer between the source/drain contact trench 530 and the substrate 504 (e.g., source/drain region 506 of the substrate).

In one aspect of the disclosure, the dielectric, insulator, and/or spacer layer may be etched up to the first upper portion section 540 proximate to the substrate 504. The section 540 may be separated from the substrate 504 by a distance 536. For example, a portion of the inter-layer dielectric 516 may remain between the source/drain region 506 of the substrate 504 and the source/drain contact trench 530. To etch to the first upper portion section 540 so that the inter-layer dielectric 516 remains between the source/drain contact trench 530 and the substrate 504, the etching may be timed to stop at the first upper portion section 540. The etching may be a reactive ion etch (RIE), for example, carbon tetrafluoride (CF4) or sulfur hexafluoride (SF6). In some aspects, the etch may be in one direction. For example, the etch may be in a direction from the second upper portion section 542 to a surface 538 of the substrate 504.

Figure 8:
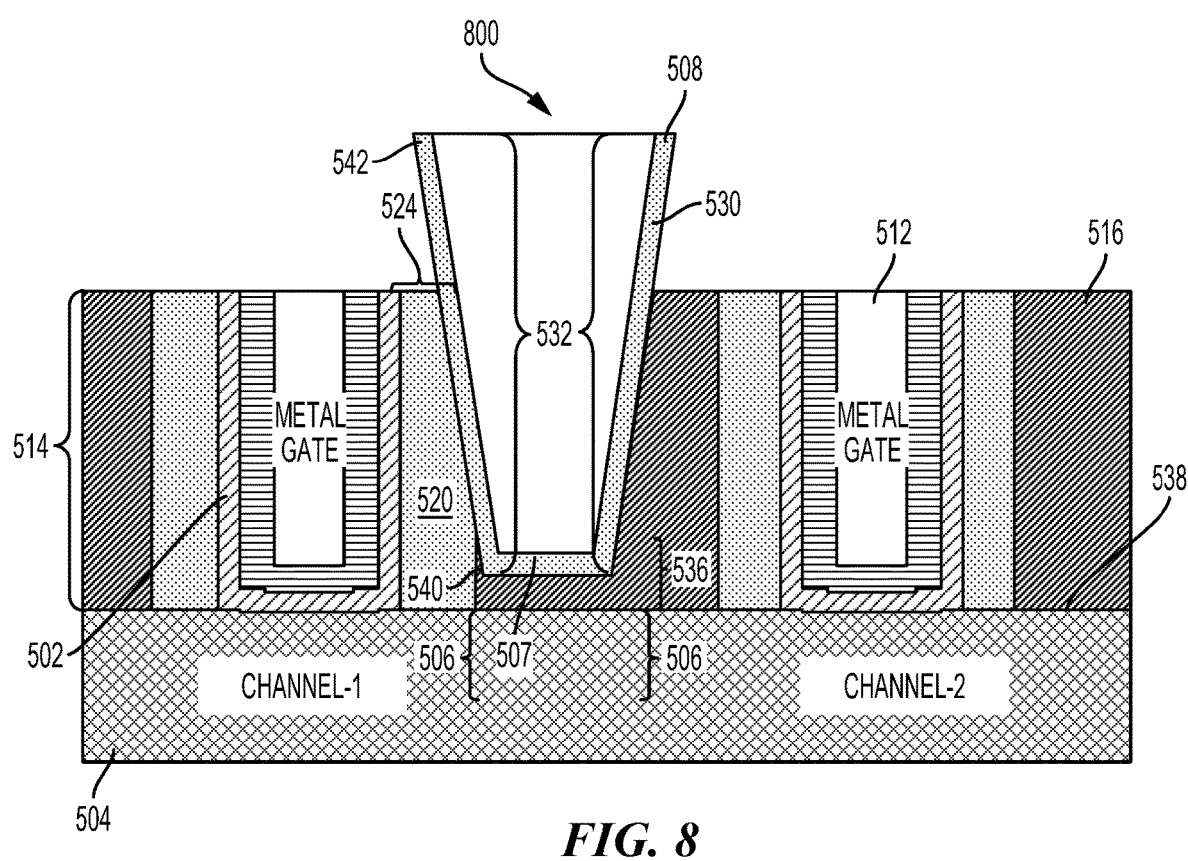

FIG. 8 illustrates a process of depositing a contact spacer liner 508 according to aspects of the present disclosure. The contact spacer liner 508 may be deposited within the source/drain contact trench 530 to separate the conductive contact 510 from the gates 502 or 512 of a semiconductor device 800. For example, the contact spacer liner 508 may be lined on one or more walls (e.g., sidewalls and/or a bottom wall or base portion 507) of the source/drain contact trench 530 and ultimately also on walls of the contact material when the source/drain contact trench 530 is filled with the contact material. The bottom wall may be on a surface of the inter-layer dielectric 516 that is between the substrate 504 and the source/drain contact trench 530. The contact spacer liner 508 may be provided by depositing the inner spacer (e.g., dielectric material) on the sidewalls and/or bottom wall of the source/drain contact trench 530 before the contact material for the conductive contact 510 fills the source/drain contact trench 530.

Figure 9A:
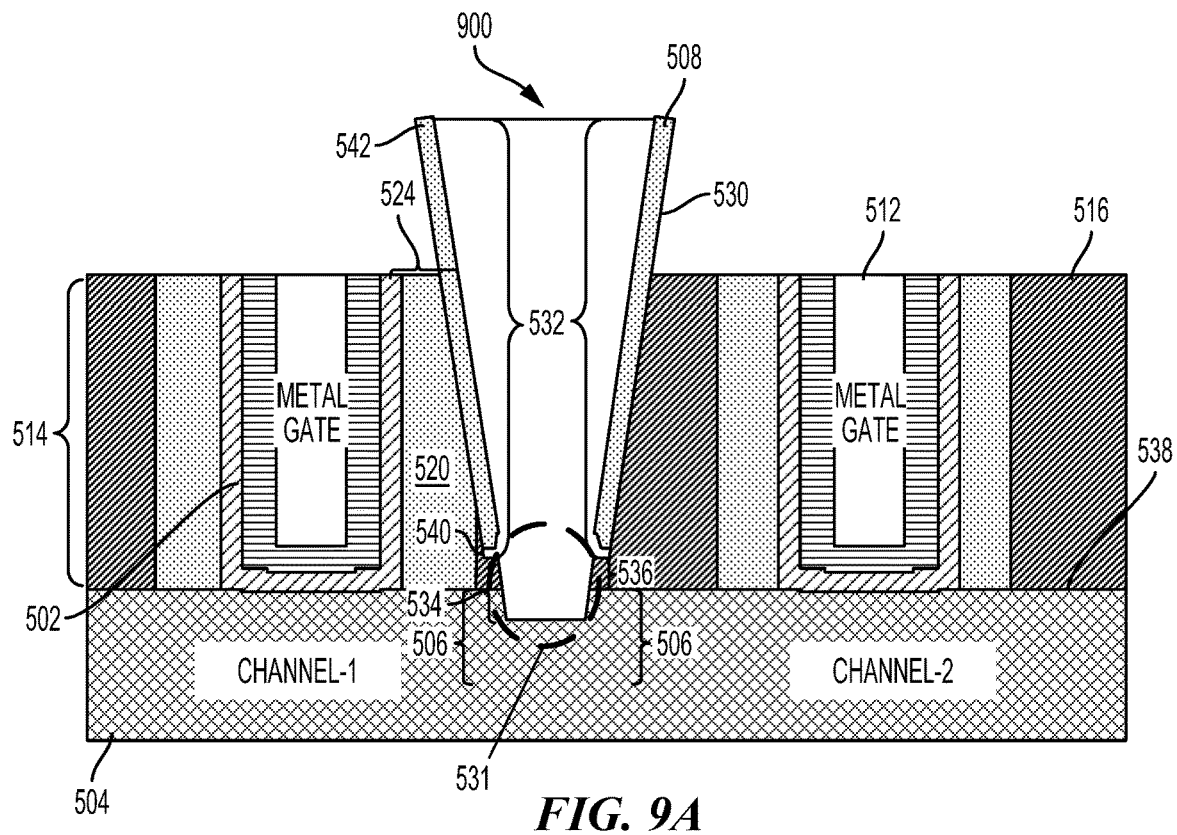

FIG. 9A illustrates a second etch of the two-step contact etch according to aspects of the present disclosure. The second etch may include etching through the contact spacer liner 508 at a base portion of the source/drain contact trench 530 to expose the source/drain region of a semiconductor device 900. For example, the second etch process may include etching through the contact spacer liner 508, through the remaining portion of the inter-layer dielectric 516 (corresponding to the distance 536) that was separating the source/drain contact trench 530 from the substrate 504 and into the substrate to expose the source/drain region 506 of the substrate 504 without etching entirely through the substrate 504. The contact spacer liner 508 is not introduced into the newly etched region, which forms an additional portion (e.g., the second portion 534) of the source/drain contact trench 530. That is, the second portion 534 of the source/drain contact trench 530 is not surrounded with the contact spacer liner 508 to prevent resistance spreading. During the second etch process, when the substrate 504 is contacted, the etch process may be slowed, which signals the start of the etch of the substrate 504. For example, the etch rate may be reduced, indicating detection of an exposure of the source/drain region 506. The second etch process may be an anisotropic etch to break through the contact spacer liner 508 at the bottom wall of the source/drain contact trench 530 and further into the source/drain region 506.

Figure 9B:
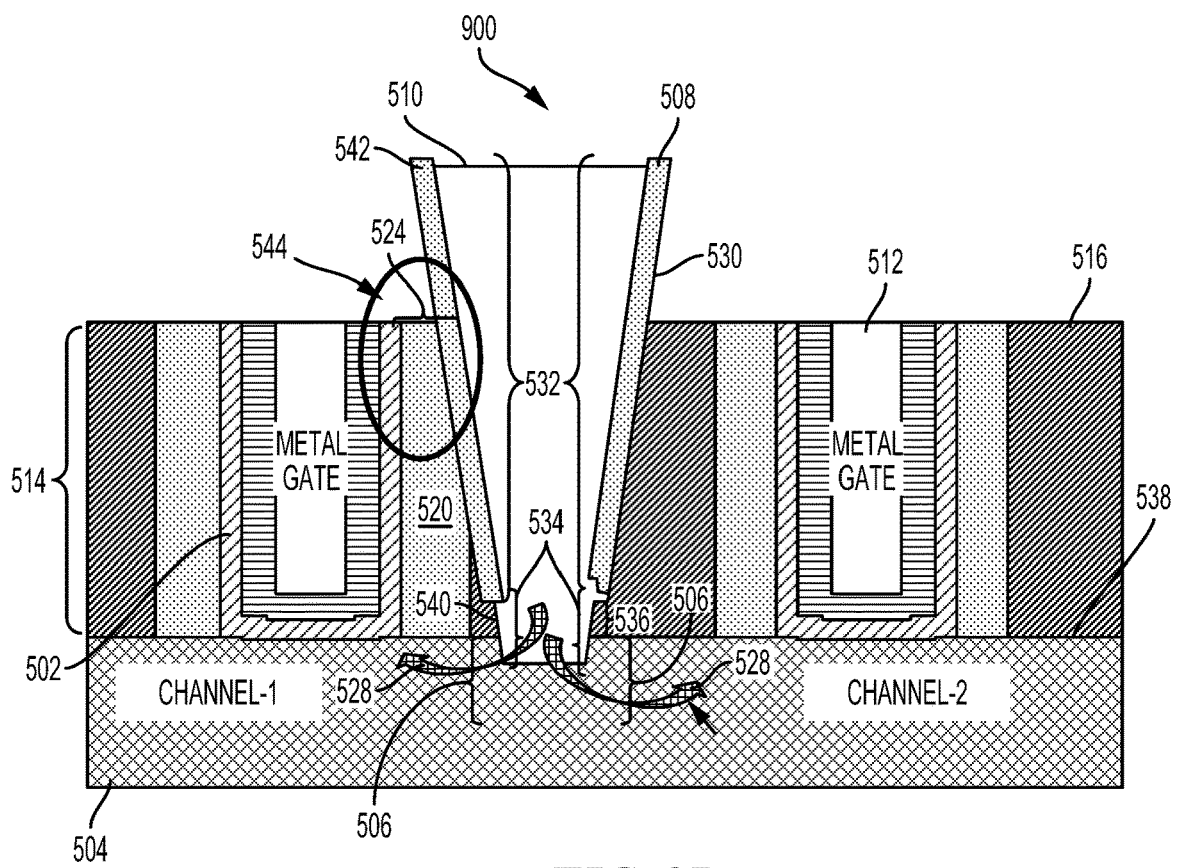

FIG. 9B further illustrates a process of forming the conductive contact 510, according to aspects of the present disclosure. A conductive material may be deposited to fill the source/drain contact trench 530 to form the conductive contact 510. For example, the conductive material may be deposited in the source/drain contact trench 530 so that the conductive material is on the exposed portion of the source/drain region 506 of the semiconductor device 900.

Figure 9C:
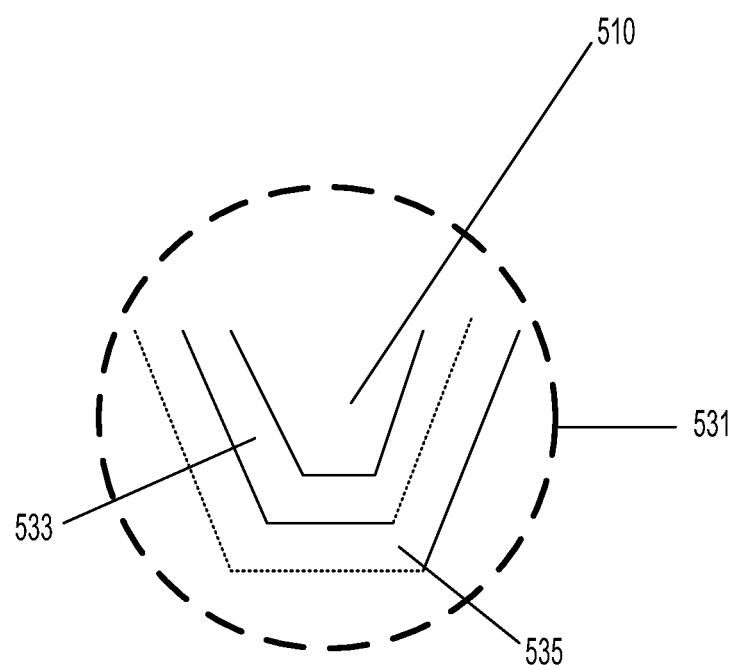
FIG. 9C illustrates multiple layers of the conductive contact within a second portion of a source/drain contact trench according to aspects of the present disclosure.

In some aspects of the disclosure, to form the conductive contact 510, multiple layers (e.g., two or more layers) may be deposited into the second portion of the source/drain contact trench 530, as illustrated in FIG. 9C.

FIG. 9C illustrates an enlarged view of multiple layers of the conductive contact 510 within the second portion 534 of the source/drain contact trench 530 of FIG. 9A, according to aspects of the present disclosure. For illustrative purposes, FIG. 9C shows an enlarged view of the section within a circle 531 of FIG. 9A. The second portion of the source/ drain contact trench may include a barrier layer 533 between a conductive material forming the conductive contact 510 and a contact layer 535.

Figure 10:
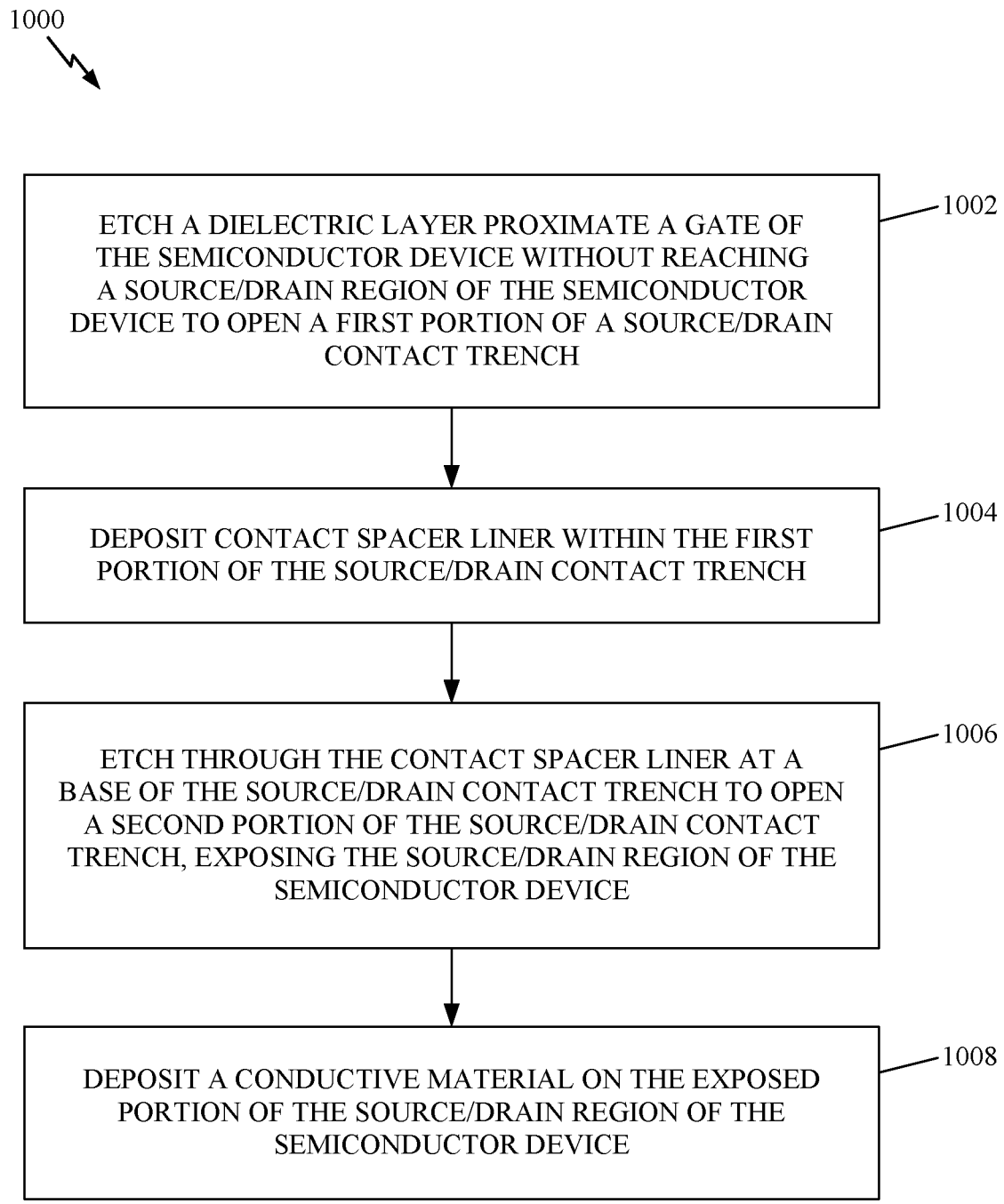
FIG. 10 is a process flow diagram illustrating semiconductor device that reduces spreading resistance and prevents or reduces contact to gate shorting according to one aspect of the present disclosure.

FIG. 10 is a process flow diagram illustrating a method 1000 for reducing spreading resistance and preventing contact to gate shorting. In block 1002, a dielectric layer may be etched proximate a gate of the semiconductor device. The etch may stop prior to reaching a source/drain region of the semiconductor device. The etch may open a first portion of a source/drain contact trench. For example, as shown in FIG. 7, the source/drain contact trench 530 may include a first portion 532 above the source/drain region 506 of the semiconductor device 700. In this arrangement, a portion of the inter-layer dielectric (ILD) remains between the source/drain region 506 and the source/drain contact trench 530. In block 1004, a contact spacer liner may be deposited within the first portion of the source/drain trench. For example, as shown in FIG. 8, the contact spacer liner 508 is deposited and may line the source/drain contact trench 530, including a base the source/drain contact trench.

In block 1006, the contact spacer liner at a base of the source/drain contact trench may be etched to open a second portion of the source/drain contact trench, exposing the source/drain region of the semiconductor device. For example, as shown in FIG. 9A, the second portion 534 of the source/drain contact trench may extend through the contact spacer liner 508 at the base of the source/drain contact trench 530, exposing and landing in the source/drain region 506 of the semiconductor device 900. Etching through the contact spacer liner 508 may include detecting exposure of the source/drain region 506 based on an etch rate. In block 1008, a conductive material may be deposited on the exposed portion of the source/drain region of the semiconductor device. For example, as shown in FIG. 9B, a conductive material (e.g., tungsten) may be deposited within the first portion 532 and the second portion of the source/drain contact trench 530 as well as on the exposed portion of the source/drain region 506 of the semiconductor device 700.

According to an aspect of the present disclosure, a semiconductor device is described. The semiconductor device may include means for electrically isolating within a source/drain contact trench. The isolating means contacts a first portion but not a second portion of the source/drain contact trench. The electrically isolating means may be the contact spacer liner 508 shown in FIGS. 7, 8, and 9A-9B. In another aspect, the aforementioned means may be any module or any apparatus configured to perform the functions recited by the aforementioned means.

Figure 11:
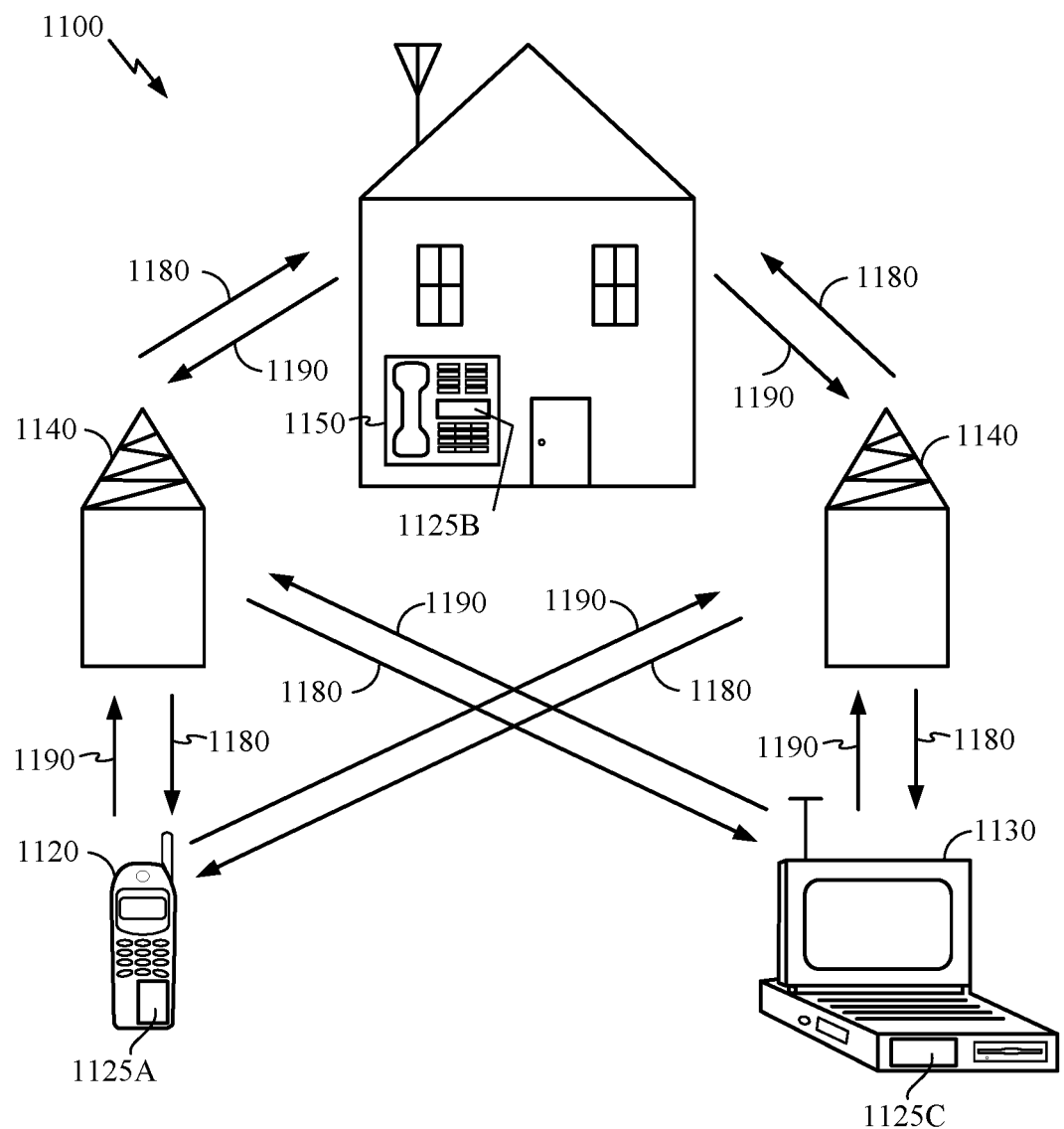
FIG. 11 is a block diagram showing an exemplary wireless communication system in which a configuration of the disclosure may be advantageously employed.

FIG. 11 is a block diagram showing an exemplary wireless communication system 1100 in which an aspect of the disclosure may be advantageously employed. For purposes of illustration, FIG. 11 shows three remote units 1120, 1130, and 1150 and two base stations 1140. It will be recognized that wireless communication systems may have many more remote units and base stations. Remote units 1120, 1130, and 1150 include IC devices 1125A, 1125C, and 1125B having the disclosed contacts. It will be recognized that other devices may also include the disclosed contacts, such as the base stations, switching devices, and network equipment. FIG. 11 shows forward link signals 1180 from the base station 1140 to the remote units 1120, 1130, and 1150 and reverse link signals 1190 from the remote units 1120, 1130, and 1150 to base stations 1140.

In FIG. 11, remote unit 1120 is shown as a mobile telephone, remote unit 1130 is shown as a portable computer, and remote unit 1150 is shown as a fixed location remote unit in a wireless local loop system. For example, the remote units may be a mobile phone, a hand-held personal communication systems (PCS) unit, a portable data unit such as a personal data assistant, a GPS enabled device, a navigation device, a set top box, a music player, a video player, an entertainment unit, a fixed location data unit, such as a meter reading equipment, or other devices that store or retrieve data or computer instructions, or combinations thereof. Although FIG. 11 illustrates remote units according to the aspects of the disclosure, the disclosure is not limited to these exemplary illustrated units. Aspects of the disclosure may be suitably employed in many devices, which include the disclosed contacts.

Figure 12:
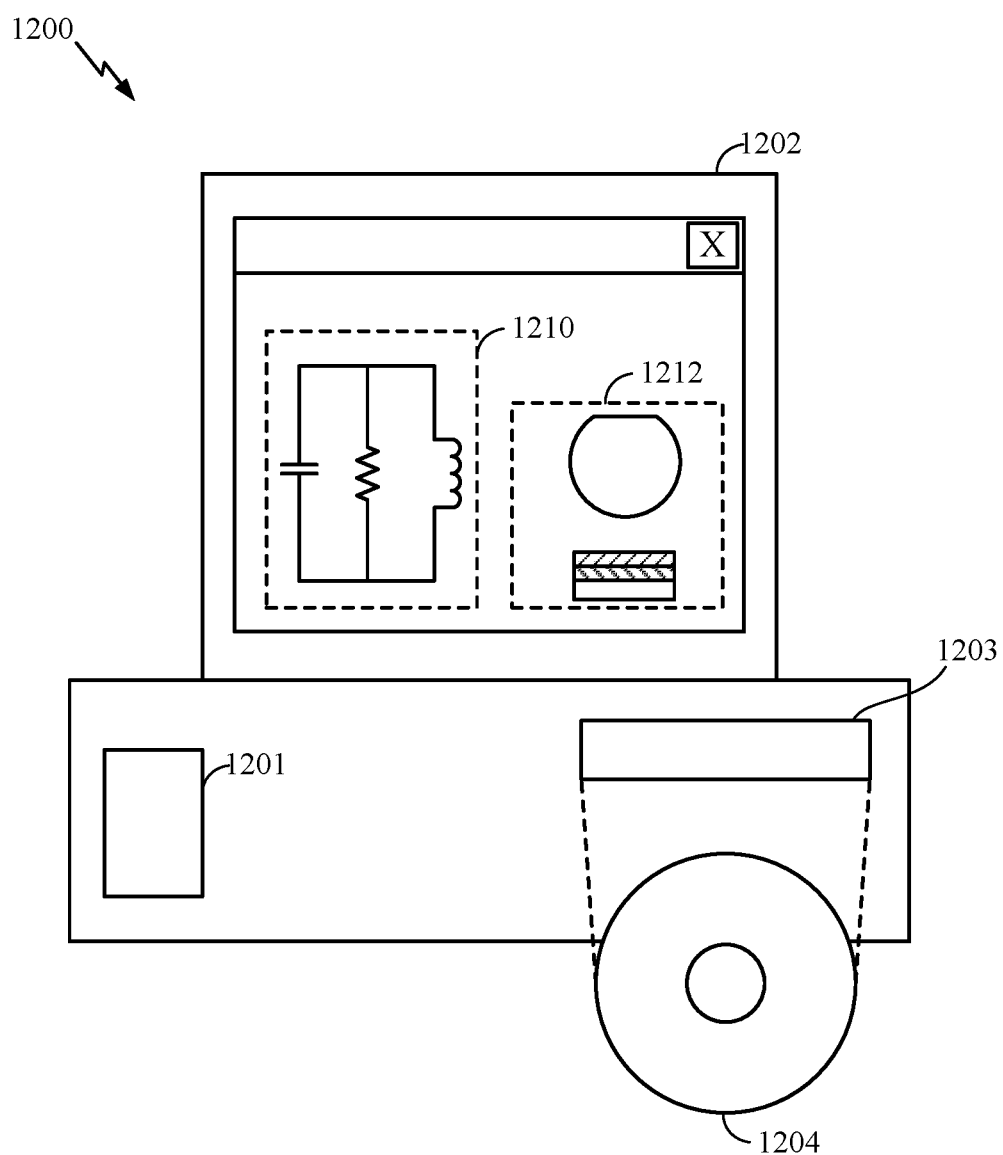
FIG. 12 is a block diagram illustrating a design workstation used for circuit, layout, and logic design of a semiconductor component according to one configuration.

FIG. 12 is a block diagram illustrating a design workstation used for circuit, layout, and logic design of a semiconductor component, such as the contacts disclosed above. A design workstation 1200 may include a hard disk 1201 containing operating system software, support files, and design software such as Cadence or OrCAD. The design workstation 1200 may also include a display 1202 to facilitate design of a circuit 1210 or a semiconductor component 1212 such as a contact in accordance with an aspect of the present disclosure. A storage medium 1204 is provided for tangibly storing the design of the circuit 1210 or the semiconductor component 1212. The design of the circuit 1210 or the semiconductor component 1212 may be stored on the storage medium 1204 in a file format such as GDSII or GERBER. The storage medium 1204 may be a CD-ROM, DVD, hard disk, flash memory, or other appropriate device. Furthermore, the design workstation 1200 may include a drive apparatus 1203 for accepting input from or writing output to the storage medium 1204.

Data recorded on the storage medium 1204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1204 facilitates the design of the circuit 1210 or the semiconductor component 1212 by decreasing the number of processes for designing semiconductor wafers.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media may include both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, may include compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A semiconductor device, comprising:
    a source/drain contact trench adjacent to a gate, the source/drain contact trench having a first portion and a second portion on the first portion, wherein the gate comprises a gate spacer on a sidewall of the gate, and wherein the first portion, but not the second portion, of the source/drain contact trench physically contacts the gate spacer;
    an insulating contact spacer liner within the source/drain contact trench and contacting the first portion but not the second portion of the source/drain contact trench; and
    a conductive material within the insulating contact spacer liner and the second portion of the source/drain contact trench, and landing in a source/drain region of a substrate of the semiconductor device.

2. The semiconductor device of claim 1, in which the conductive material is separated from the gate spacer by the insulating contact spacer liner and an inter-layer dielectric.

3. The semiconductor device of claim 1, in which the insulating contact spacer liner contacts the sidewall of the gate spacer and electrically isolates the conductive material from the gate.

4. The semiconductor device of claim 1, in which the second portion includes the conductive material, a contact layer, and a barrier layer positioned between the conductive material and the contact layer.

5. The semiconductor device of claim 4, in which the contact layer comprises titanium and/or nickel.

6. The semiconductor device of claim 4, in which the barrier layer comprises tantalum nitride and/or titanium nitride.

7. The semiconductor device of claim 1, in which the conductive material comprises tungsten, aluminum, copper, titanium, or cobalt.

8. The semiconductor device of claim 1, in which the second portion of the source/drain contact trench is partially below a surface of the substrate of the semiconductor device.

9. A semiconductor device, comprising:
    a source/drain contact trench adjacent to a gate, the source/drain contact trench having a first portion and a second portion on the first portion, wherein the gate comprises a gate spacer on a sidewall of the gate, and wherein the first portion, but not the second portion, of the source/drain contact trench physically contacts the gate spacer;

means for electrically isolating the source/drain contact trench, the isolating means lining the first portion but not the second portion of the source/drain contact trench; and a conductive material within the isolating means and the second portion of the source/drain contact trench, and landing in a source/drain region of a substrate of the semiconductor device.

10. The semiconductor device of claim 9, in which the second portion includes the conductive material, a contact layer, and a barrier layer positioned between the conductive material and the contact layer.

11. The semiconductor device of claim 10, in which the contact layer comprises titanium and/or nickel.

12. The semiconductor device of claim 10, in which the barrier layer comprises tantalum nitride and/or titanium nitride.

* * * * *